(12) United States Patent
Goto

(10) Patent No.: US 12,278,105 B2
(45) Date of Patent: Apr. 15, 2025

(54) METHOD FOR PRODUCING EPITAXIAL SILICON WAFER

(71) Applicant: SUMCO CORPORATION, Tokyo (JP)

(72) Inventor: Motoki Goto, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 416 days.

(21) Appl. No.: 17/787,097

(22) PCT Filed: Oct. 28, 2020

(86) PCT No.: PCT/JP2020/040458
§ 371 (c)(1),
(2) Date: Jun. 17, 2022

(87) PCT Pub. No.: WO2021/124693
PCT Pub. Date: Jun. 24, 2021

(65) Prior Publication Data
US 2023/0044686 A1    Feb. 9, 2023

(30) Foreign Application Priority Data
Dec. 19, 2019 (JP) ................................. 2019-229687

(51) Int. Cl.
*C30B 25/14* (2006.01)
*C23C 16/24* (2006.01)
(Continued)

(52) U.S. Cl.
CPC ........ *H01L 21/02381* (2013.01); *C23C 16/24* (2013.01); *C23C 16/4405* (2013.01);
(Continued)

(58) Field of Classification Search
CPC ......... H01L 21/02381; H01L 21/02532; H01L 21/0262; C23C 16/24; C23C 16/4405; C30B 25/10; C30B 25/14; C30B 29/06
See application file for complete search history.

(56) References Cited

U.S. PATENT DOCUMENTS 5,616,208 A * 4/1997 Lee ................... H01L 21/67017
134/1.1
6,277,194 B1 * 8/2001 Thilderkvist ....... C23C 16/4405
216/37

FOREIGN PATENT DOCUMENTS

| JP | H07-142391 A | 6/1995 |
|---|---|---|
| JP | 2014-229821 A | 12/2014 |
| WO | 2015/030047 A1 | 3/2015 |

OTHER PUBLICATIONS

ISR issued in International Patent Application No. PCT/JP2020/040458, Jan. 19, 2021, translation.
(Continued)

*Primary Examiner* — Victor A Mandala
*Assistant Examiner* — Colleen E Snow
(74) *Attorney, Agent, or Firm* — GREENBLUM & BERNSTEIN P.L.C.

(57) ABSTRACT

A method of producing an epitaxial silicon wafer, including: loading a wafer into a chamber; performing epitaxial growth; unloading the epitaxial silicon wafer from the chamber; and then cleaning the inside of the chamber using hydrochloric gas. After the cleaning is performed, whether components provided in the chamber are to be replaced or not is determined based on the cumulative amount of the hydrochloric gas supplied. The components have a base material that includes graphite and is coated with a silicon carbide film.

4 Claims, 4 Drawing Sheets

(51) Int. Cl.
*C23C 16/44* (2006.01)
*C30B 25/10* (2006.01)
*C30B 29/06* (2006.01)
*H01L 21/02* (2006.01)

(52) U.S. Cl.
CPC .............. *C30B 25/10* (2013.01); *C30B 25/14* (2013.01); *C30B 29/06* (2013.01); *H01L 21/02532* (2013.01); *H01L 21/0262* (2013.01)

(56) References Cited

OTHER PUBLICATIONS

IPRP issued in International Patent Application No. PCT/JP2020/040458, May 17, 2022, translation.

\* cited by examiner

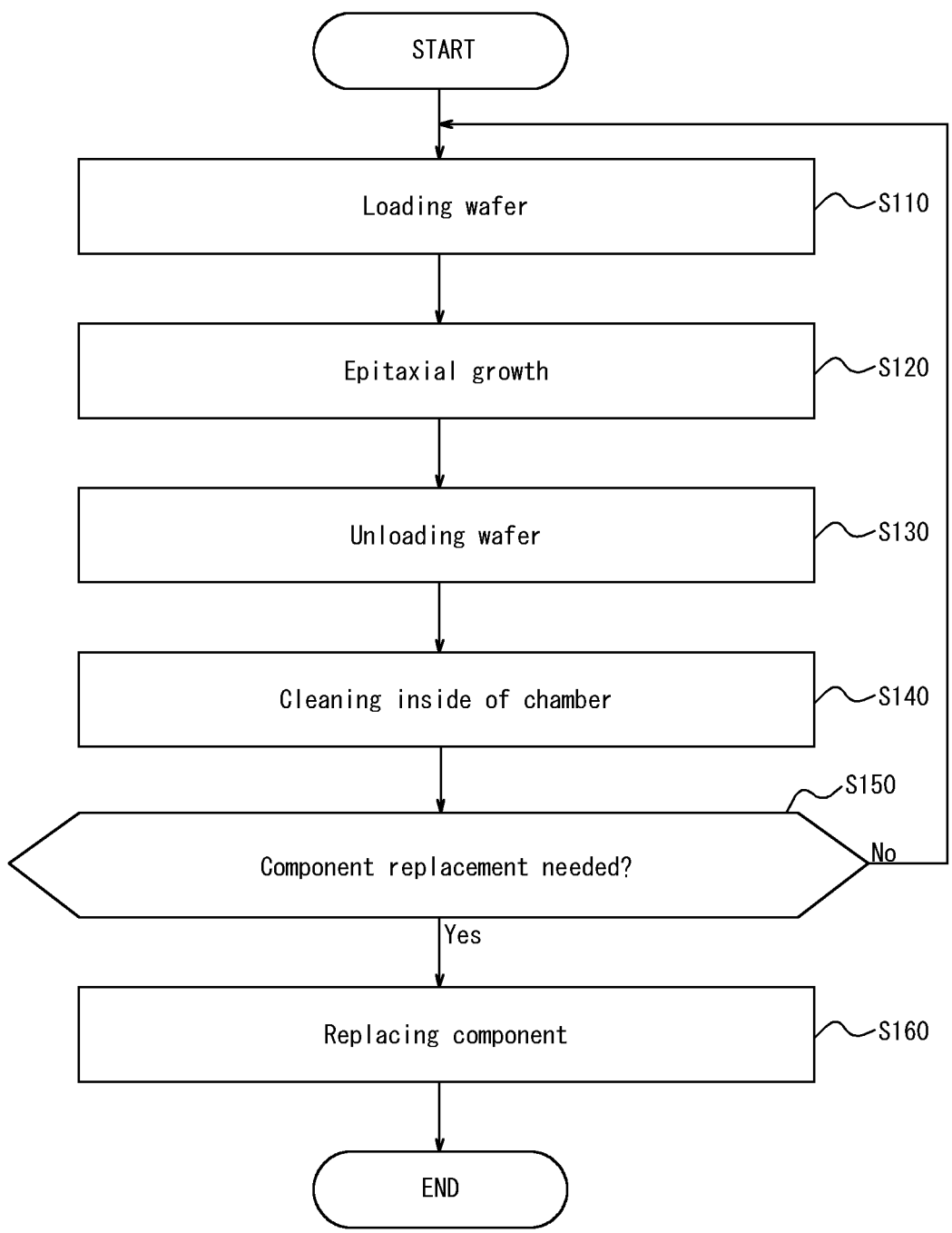

METHOD FOR PRODUCING EPITAXIAL SILICON WAFER

TECHNICAL FIELD

This disclosure relates to a method of producing epitaxial silicon wafers.

BACKGROUND

Epitaxial silicon wafers are sequentially formed through repeating cycles each including loading of a wafer into a chamber of an epitaxial growth apparatus, epitaxial growth, and unloading of the wafer from the chamber.

In the epitaxial growth, the byproduct resulting from the source gas is deposited on the inner wall of the chamber and on components provided in the chamber. If the above cycles are repeated with those byproducts being left, particles are generated from the byproducts, detrimentally affecting the quality of the epitaxial silicon wafers. Accordingly, it is necessary to remove the byproduct deposited on the components in the chamber after repeating the above cycle a certain number of times. Methods to remove the byproduct include a method of performing a cleaning process in which the components in the chamber are heated and the byproduct deposited on the component is removed using an etching gas, and a method taking the component on which the byproduct is deposited out of the chamber and removing the byproduct by etching such as wet etching or dry etching. The component from which the byproduct is removed can be repeatedly used for epitaxial growth; however, since repeating the cleaning process and etching many times reduces the quality of epitaxial silicon wafers to be obtained, the components need to be replaced.

WO 2015/030047 A (PTL 1) discloses a technique of replacing wafer holders such as a susceptor when the cumulative film thickness of a byproduct deposited on the wafer holders exceeds a predetermined threshold value while repeating the cycles described above.

CITATION LIST

Patent Literature

PTL 1: WO 2015/030047 A

SUMMARY

Technical Problem

In PTL 1, components provided in a chamber are replaced based on the cumulative film thickness of the byproduct. The present inventors performed the experiments below, assuming that the thickness of the byproduct deposited on the surface of the components was equivalent to the film thickness of an epitaxial layer to be grown on a silicon wafer, and found that there was a risk of reduction in the quality of epitaxial silicon wafers when whether to replace components in the chamber or not was determined based on the cumulative film thickness. Specifically, in the experiments, a process of loading a wafer into a chamber, epitaxial growth, and loading the wafer from the chamber was repeated a plurality of times, and a process of cleaning the inside of the chamber using hydrochloric gas was then repeated a plurality of times. After that, whether to replace the components in the chamber was determined based on the cumulative film thickness as in PTL 1. The experiments demonstrated that there was a risk of reduction in the quality of epitaxial silicon wafers when whether to replace the components in the chamber or not was determined based on the cumulative film thickness.

In view of the above problem, it could be helpful to provide a method of producing epitaxial silicon wafers that reduces the risk of reduction in the quality of the epitaxial silicon wafers.

Solution to Problem

With a view to solving the above problem, the present inventors investigated the quality of silicon epitaxial layers. The investigation demonstrated that even if the cumulative film thickness of a byproduct is the same, the number of cleanings performed after epitaxial growth would have an influence on the quality of epitaxial silicon wafers. When epitaxial growth is performed, regions where byproducts are deposited and regions with little deposit are formed on the components in a chamber, and the regions with little deposit of the byproduct are directly exposed to hydrochloric gas during cleaning. In particular, as the cleaning frequency is higher, the regions with little deposit of the byproduct on components in which a base material including graphite is coated with a silicon carbide film are etched more with the hydrochloric gas. Further, when the film thickness of the remaining silicon carbide film is reduced by etching, the amount of graphite or metal in the base material that permeates through the silicon carbide film increases, and the quality of epitaxial silicon wafers is reduced. Specifically, it was found that when the cumulative film thickness of the byproduct is the same, the film thickness of the remaining silicon carbide film of the regions where no byproduct is deposited varies depending on the cleaning frequency, which results in a risk of reduction in the quality of epitaxial silicon wafers. Further studies revealed that focusing on the cumulative hydrochloric gas supply amount and the cumulative etching amount that have a strong correlation with the film thickness of the remaining silicon carbide film, the timing for replacing components such as a susceptor can be correctly determined, thus the risk of reduction in the quality of epitaxial silicon wafers can be reduced.

This disclosure is based on the above findings, and we propose the following features.

(1) A method of producing an epitaxial silicon wafer, comprising:

loading a silicon wafer into a chamber in an epitaxial growth apparatus;

supplying a source gas into the chamber to grow a silicon epitaxial layer on the silicon wafer, thereby making the silicon wafer form an epitaxial silicon wafer;

unloading the epitaxial silicon wafer from the chamber; and then supplying a hydrochloric gas into the chamber thereby cleaning the inside of the chamber, wherein after the cleaning is performed, whether at least one component provided in the chamber is to be replaced or not is determined based on a cumulative amount of the hydrochloric gas supplied, the at least one component comprising a base material that includes graphite and is coated with a silicon carbide film.

(2) The method of producing an epitaxial silicon wafer, according to (1) above, wherein the epitaxial growth apparatus includes a susceptor on which the silicon wafer is placed, and a preheat ring provided around the susceptor with a predetermined gap therebetween, and the at least one component is one or more components selected from the susceptor and the preheat ring.

(3) The method of producing an epitaxial silicon wafer, according to (1) or (2) above, wherein an amount of the hydrochloric gas supplied is measured during the cleaning, and after performing the cleaning before the cumulative amount of the hydrochloric gas supplied exceeds a predetermined threshold value, the at least one component is determined to be replaced.

Advantageous Effect

This disclosure can reduce the risk of reduction in the quality of epitaxial silicon wafers.

BRIEF DESCRIPTION OF THE DRAWINGS

In the accompanying drawings:

FIG. 5 is a flowchart illustrating a method of producing an epitaxial silicon wafer according to one embodiment of this disclosure.

DETAILED DESCRIPTION

Embodiments of the method of producing epitaxial wafers, according to this disclosure will now be described in detail with reference to the drawings.
(Epitaxial Growth Apparatus)

Figure 1:
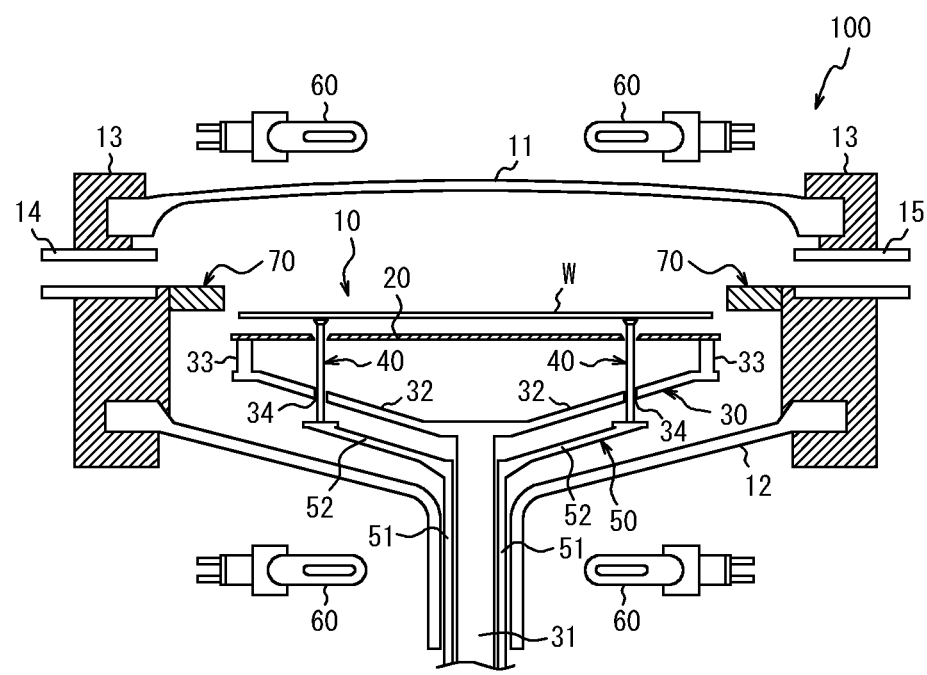
FIG. 1 is a schematic view of an epitaxial growth apparatus 100 that can be used in one embodiment of this disclosure.

With reference to FIG. 1, an epitaxial growth apparatus 100 that can be used in one embodiment of this disclosure will be described. The epitaxial growth apparatus 100 includes a chamber 10, a susceptor 20, a susceptor support shaft 30, three lift pins 40 (one of them is not shown), an elevating shaft 50, heating lamps 60, a preheat ring 70, gas flow meters (not shown), and a control unit (not shown).
[Chamber]

The chamber 10 includes an upper dome 11, a lower dome 12, and a dome mounting member 13, and the chamber 10 defines a growth chamber for silicon epitaxial layers. The chamber 10 is provided with a gas supply port 14 and a gas discharge port 15 for supplying and discharging a source gas or hydrochloric gas at opposing positions in the side surface of the chamber.
[Susceptor]

Figure 2:
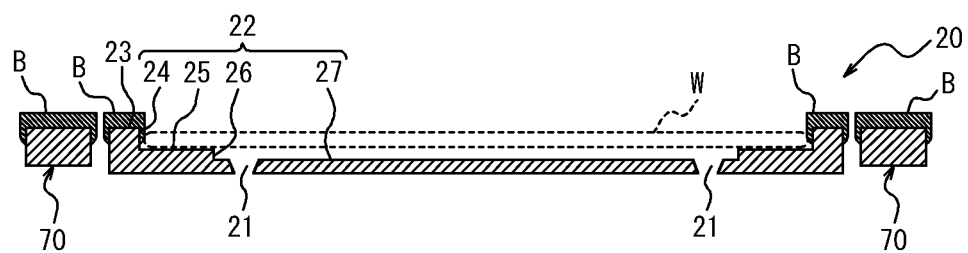
FIG. 2 is a schematic view illustrating the positional relationship of a susceptor 20 and a preheat ring 70 included in the epitaxial growth apparatus 100 with a silicon wafer W during epitaxial growth; and a byproduct B deposited during epitaxial growth.

The susceptor 20 is a disk-shaped component on which a silicon wafer W is placed inside the chamber 10. Of the surfaces of the susceptor 20, one on the upper dome 11 side is the front surface of the susceptor 20, whereas one on the other side is the rear surface of the susceptor 20. Referring also to FIG. 2, a circular recess (hereinafter referred to as a "counterbore portion") 22 in which the silicon wafer W is placed is formed in the front surface of the susceptor 20. Further, the front surface of the susceptor 20 includes a front surface outermost circumferential portion 23, a first vertical wall surface 24, a wafer supporting surface 25, a second vertical wall surface 26, and a front surface center portion 27. The counterbore portion 22 includes the first vertical wall surface 24, the wafer supporting surface 25, the second vertical wall surface 26, and the front surface center portion 27. The front surface outermost circumferential portion 23 lies around the counterbore portion 22. The first vertical wall surface 24 is a wall surface that extends from the inner circumferential end of the front surface outermost circumferential portion 23 and constitutes a part of the counterbore portion 22. The wafer supporting surface 25 is a flat surface that extends from the first vertical wall surface 24 and constitutes a part of the counterbore portion 22, and supports the periphery of the rear surface of the silicon wafer W by contact. The second vertical wall surface 26 is a wall surface that extends from the inner circumferential end of the wafer supporting surface 25 and constitutes a part of the counterbore portion 22. The front surface center portion 27 extends from the second vertical wall surface 26 and constitutes a part of the bottom surface of the counterbore portion 22. Further, the susceptor 20 has three through holes 21 (one of them is not shown) that extend through the susceptor 20 from the front surface thereof to the rear surface thereof at regular intervals of 120° in the circumferential direction. As illustrated in FIG. 1, the lift pins 40 to be described are inserted into the respective through holes 21. The susceptor 20 may be a component in which a base material including graphite is coated with a silicon carbide film (for example, a SiC film with a Vickers hardness of 2,346 $kgf/mm^2$). Note that "the periphery of the rear surface of the silicon wafer" herein means an annular region in the rear surface of the silicon wafer W that has a width of approximately 2 mm from the outer circumferential end of the silicon wafer toward the center thereof.
[Susceptor Support Shaft]

The susceptor support shaft 30 supports the susceptor 20 from below inside the chamber 10 and has a main shaft 31, three arms 32 (one of them is not shown), and three supporting pins 33 (one of them is not shown). The main shaft 31 is placed to have an axis passing through the center of the susceptor 20. The three arms 32 radially extend below the periphery of the susceptor 20 from the main shaft 31. A cross section of each arm 32 perpendicular to the direction in which the arm extends has a rectangular shape, and of the four surfaces of each arm 32, one on the susceptor 20 side is the upper surface of the arm 32, and the opposite surface is the lower surface of the arm 32. Each arm 32 has a through hole 34 extending through the arm 32 from the upper surface to the lower surface. The lift pins 40 to be described are inserted into the respective through holes 34. Each supporting pin 33 directly supports the susceptor 20 at the end of the corresponding arm 32. The susceptor support shaft 30 is moved up and down in the vertical direction thereby raising and lowering the susceptor 20 in the up and down directions. The susceptor support shaft 30 is preferably made of quartz (Vickers hardness: 1,103 $kgf/mm^2$), more preferably made of synthetic quartz. Additionally, in the specification, "the periphery of the susceptor" means a part of the susceptor 20 excluding a region having a radius that is 80% of the susceptor radius around the center of the susceptor 20. Further, the number of the arms 32 in the epitaxial growth apparatus 100 is three, but is not limited thereto.

[Lift Pins]

Each lift pin 40 is inserted into the corresponding through hole 21 in the susceptor 20 and the corresponding through hole 34 in the corresponding arm 32, and is raised and lowered in the up and down directions by the elevating shaft 50 to be described. The material of each lift pin 40 may be quartz, SiC, or glassy carbon. The number of the lift pins 40 in the epitaxial growth apparatus 100 is three, but is not limited thereto.

[Elevating Shaft]

The elevating shaft 50 has a main shaft 51 of the elevating shaft that has a common rotation axis with the main shaft 31 of the susceptor support shaft and has three supporting shafts 52 branching off from the tip of the main shaft 51 of the elevating shaft. The main shaft 51 of the elevating shaft defines a hollow that houses the main shaft 31 of the susceptor support shaft. Further, the lower end of each lift pin 40 is supported at the end of the corresponding supporting shaft 52. The elevating shaft 50 is moved up and down in the vertical direction thereby raising and lowering the lift pins 40 in the up and down directions when the silicon wafer W is loaded and unloaded. The elevating shaft 50 is preferably made of quartz.

[Heating Lamps]

The heating lamps 60 are placed in a region above the chamber 10 and in a region below the chamber 10. The heating lamps 60 preferably use a halogen lamp or an infrared lamp which is quickly heated/cooled and excellent in temperature controllability.

[Preheat Ring]

The preheat ring 70 is provided around the susceptor 20 with a gap of 1 mm to 3 mm therebetween. The preheat ring 70 may be a component in which a base material including graphite is coated with a silicon carbide film (for example, a SiC film with a Vickers hardness of 2,346 kgf/mm$^2$). The preheat ring 70 is heated by the heating lamps 60 and preheats a source gas supplied into the chamber 10 before the source gas reaches the silicon wafer W and preheats the susceptor 20. This increases the thermal uniformity of a silicon wafer before being subjected to epitaxial growth and while being subjected to epitaxial growth. Specifically, the temperature of the periphery of the susceptor 20 can be kept equivalent to the temperature of its center. Thus, the temperature of the inner circumferential portion of the preheat ring 70 is equivalent to the temperature of the susceptor 20 being heated.

[Gas Flow Meter]

The gas flow meters may be mass flow controllers. Mass flow controllers corresponding to all respective gases including hydrochloric gas introduced into the chamber 10 are placed. The mass flow controllers are placed in an area at room temperature upstream of the gas supply port 14 and each regulates the flow rate of the gas to a set value with high accuracy and determines the flow rate (that is, the amount supplied) of the gas by measurements.

[Control Unit]

The control unit has a calculation unit that calculates the cumulative hydrochloric gas supply amount and a determination unit that determines whether or not to replace components in the chamber 10 based on the cumulative hydrochloric gas supply amount. The control unit can be implemented by, for example, a central processing unit (CPU) in a computer. Thus, the determination based on the measured flow rate of hydrochloric gas makes it possible to appropriately determine whether to replace the components.

(Method of Producing Epitaxial Silicon Wafer)

With reference to FIG. 1, the following describes an example of the method of producing epitaxial silicon wafers that can be performed using the epitaxial growth apparatus 100 described above. It should be noted that the cumulative hydrochloric gas supply amount is initialized.

[Loading Wafer]

In step S110, the silicon wafer W is loaded into the chamber 10 previously heated to 600° C. or more and 900° C. or less by the lamps 60 and placed on the susceptor 20 using a transfer blade. The silicon wafer W is then temporarily supported by the lift pins 40. After that, the susceptor 20 is moved upward and the silicon wafer W is placed on the susceptor 20.

[Epitaxial Growth]

Subsequently, in step S120, the temperature inside the chamber 10 is increased to 1000° C. or more and 1200° C. or less by the heating lamps 60. After that, a source gas such as trichlorosilane or dichlorosilane is supplied into the chamber 10 through the gas supply port 14. As a result, the source gas flows in a laminar flow state along the front surface of the silicon wafer W, which grows a silicon epitaxial layer on the silicon wafer W, thus an epitaxial silicon wafer W is obtained.

Before performing epitaxial growth, a natural oxide film formed on the surface of the silicon wafer W is preferably removed by performing hydrogen baking. Conditions for the hydrogen baking are that a hydrogen atmosphere is established in the chamber 10 and the silicon wafer W is retained in the chamber 10 having been heated to a temperature range of 1100° C. or more and 1200° C. or less by the heating lamps 60 for 30 s or more and 1 min or less. Note that etching with hydrogen chloride may be performed on the wafer before performing epitaxial growth. In the etching, a thin layer of the wafer is removed from its surface by supplying hydrogen chloride into the chamber 10 for 1 min or less at 1 SLM or less. This amount of hydrogen chloride supplied hardly etches the susceptor 20 and the preheat ring 70.

[Unloading Wafer]

Subsequently, in step S130, the temperature inside the chamber 10 is reduced from 1000° C. or more and 1200° C. or less to 600° C. or more to 900° C. or less. After that, the susceptor 20 is moved downward and the epitaxial silicon wafer W is temporarily supported by the lift pins 40. Subsequently, the epitaxial silicon wafer W is transferred from the lift pins 40 to the transfer blade, and is then unloaded from the chamber 10 together with the transfer blade.

[Cleaning Inside of Chamber]

Figure 3A:
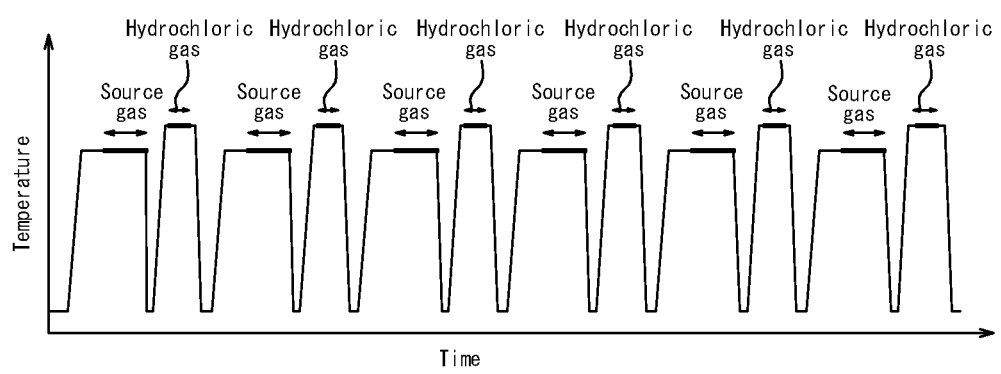
FIG. 3A is a graph illustrating the temperature history of the inside of a chamber 10 in a single wafer deposition process.
Figure 3B:
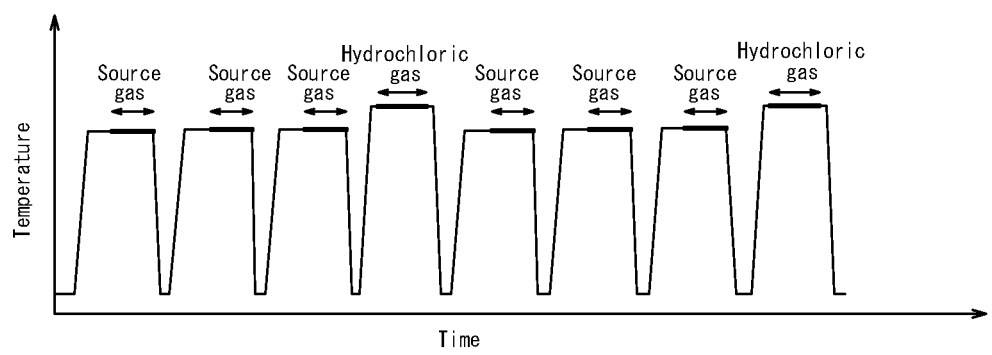
FIG. 3B is a graph illustrating the temperature history of the inside of the chamber 10 in a multi-wafer deposition process.

In this embodiment, after performing loading of a wafer, epitaxial growth, and unloading of the wafer as described above, cleaning to be described is performed. It should be noted that the cleaning frequency is not limited. For example, as illustrated in FIG. 3A, this disclosure can be applied to a single wafer deposition process in which a cleaning is performed each time after performing a cycle of loading a wafer, epitaxial growth, and unloading the wafer. Alternatively, as illustrated in FIG. 3B, this disclosure can be applied to a multi-wafer deposition process in which a cleaning is performed after repeating 2 to 8 cycles of loading a wafer, epitaxial growth, and unloading the wafer. In FIGS. 3A and 3B, the periods during which the "source gas" is supplied, indicated by the arrows, correspond to the epitaxial growth time, and the periods during which the "hydrochloric gas" is supplied, indicated by the arrows, correspond to the cleaning time. Further, "the reciprocal of the number of epitaxial growths from the end of the previous cleaning to the start of the current cleaning" is used as an indicator that indicates the cleaning frequency; and when the indicator is larger, the cleaning frequency is higher. In FIG. 3A, the indicator is 1/1, and in FIG. 3B, the indicator is 1/3, thus the cleaning frequency is higher in the case of FIG. 3A than in the case of FIG. 3B.

When epitaxial growth is performed, the byproduct B of silicon resulting from the source gas is deposited on the surface of the components provided in the chamber 10 as illustrated in FIG. 2. The byproduct B increases in film thickness as the epitaxial growth is repeated, and adheres to the surface of the silicon epitaxial layer in the form of particles, which reduces the quality of epitaxial silicon wafers. Accordingly, the byproduct B needs to be removed by cleaning the inside of the chamber 10 on a regular basis.

This being the case, in step S140, a hydrochloric gas is supplied into the chamber 10 through the gas supply port 14 to clean the inside of the chamber 10. This causes a reaction between the hydrochloric gas and the byproduct, thus the byproduct is etched away.

Typically with a view to removing the byproduct, the hydrochloric gas supply time can be calculated for example using the formula (1) given below such that over-etching is performed, namely the thickness of the etched portion is larger than the cumulative thickness of the byproduct.

[Hydrochloric gas supply time]=[Deposition rate×
Total epitaxial growth time from end of previous cleaning to start of current cleaning]/[Etching rate]+[Over-etching time] (1)

The [Deposition rate×Total epitaxial growth time from end of previous cleaning to start of current cleaning] may be substituted by the cumulative film thickness of the epitaxial layer grown on the surface of each wafer. The byproduct is preferably etched assuming that the cumulative film thickness of the epitaxial layers is equivalent to or less than the cumulative thickness of the byproduct deposited on the components. Further, the deposition rate of the epitaxial layer is preferably 0.5 μm/min or more and 4.0 μm/min or less. When the deposition rate is 0.5 μm/min or more, growth to a predetermined film thickness would not take excessively long time; whereas, when the deposition rate is 4.0 μm/min or less, the surface of the wafer or the surfaces of the byproduct on the components would not be roughened by excessively fast growth of the epitaxial layer, and LPDs would not be formed. The [Total epitaxial growth time from end of previous cleaning to start of current cleaning] is the cumulative period of time during which the source gas is introduced into the chamber 10. Accordingly, in the case of the single wafer deposition process, a period of time during which a source gas is introduced into the chamber 10 for epitaxial growth on one silicon wafer is the [Total epitaxial growth time from end of previous cleaning to start of current cleaning]. On the other hand, in the case of the multi-wafer deposition process, a cumulative period of time during which a source gas is introduced into the chamber 10 for epitaxial growth on a plurality of silicon wafers is the [Total epitaxial growth time from end of previous cleaning to start of current cleaning]. The [Over-etching time] is preferably set as a time during which 5% to 20% of the cumulative thickness of the byproduct can be removed.

The hydrochloric gas is preferably supplied after the temperature inside the chamber 10 is maintained at 1150° C. or more and 1200° C. or less using the heating lamps 60. Temperatures of 1150° C. or more allow the hydrochloric gas and the byproduct to react sufficiently, so that the byproduct is efficiently etched, whereas temperatures of 1200° C. or less cause less load on the epitaxial growth apparatus.

[Determining Whether to Replace Component or Not]

As described above, when cleaning is repeated, of the components provided in the chamber 10, components in which a base material including graphite is coated with a silicon carbide film become thinner because the hydrochloric gas etches the silicon carbide film. Further, when the graphite in the base material permeates through the thinned silicon carbide film and adheres to the surface of the silicon epitaxial layer, the quality of the epitaxial silicon wafers would be reduced. Therefore, after repeating cleaning a plurality of times, the components thinned by etching of silicon carbide needs to be replaced. Note that when the wafer is etched, the silicon carbide is hardly etched, so that the etching amount of the silicon carbide is not necessarily taken into account.

Now, in step S150, whether to replace a component provided in the chamber 10, in which a base material including graphite is coated with a silicon carbide film, is determined based on the cumulative amount of the hydrochloric gas supplied in cleaning. When the component is determined to be replaced (step S150: Yes), the process proceeds to step S160. On the other hand, when the component is determined not to be replaced (step S150: No), the process returns to step S110.

In this embodiment, as an indicator for determining whether to replace a component or not, the cumulative hydrochloric gas supply amount is used. Specifically, the determination is performed as follows. During cleaning, the gas flow meter measures the hydrochloric gas supply amount defined by the formula (2) given below.

[Hydrochloric gas supply amount in one cleaning]=
[Flow rate of hydrochloric gas in the cleaning]×
[Hydrochloric gas supply time in the cleaning] (2)

Alternatively, the hydrochloric gas supply amount in one cleaning may be found from [Hydrochloric gas supply amount in one cleaning]=Σ[Flow rate of hydrochloric gas, measured per unit time]. This makes it possible to calculate the accurate supply amount of the hydrochloric gas even when time variation occurs. In the formula, "Σ" means that the flow rates during the cleaning time of the cleaning are summed.

Further, each time a cleaning ends, the calculation unit included in the control unit (not shown) calculates the cumulative hydrochloric gas supply amount, defined by the formula (3) given below.

[Cumulative hydrochloric gas supply amount]=
[Amount of hydrochloric gas supplied in current cleaning]+[Amount of hydrochloric gas supplied before start of current cleaning] (3)

Note that the "cumulative hydrochloric gas supply amount" is initialized to 0 (L) after a component replacement.

After that, the determination unit included in the control unit determines whether or not the difference between the calculated cumulative hydrochloric gas supply amount and a predetermined threshold value is less than a predetermined value.

The threshold value of the cumulative hydrochloric gas supply amount can be previously found by determining the relationship between the cumulative hydrochloric gas supply amount and the recombination lifetime, which is a typical measure of the quality of epitaxial wafers. Specifically, the film thickness of the silicon carbide film gradually decreases as the hydrochloric gas supply amount increases, and when the film thickness becomes less than a predetermined value, the recombination lifetime sharply decreases due to graphite having permeated through the silicon carbide film. In that respect, the cumulative hydrochloric gas supply amount immediately before the sharp decrease of the recombination lifetime is set as the "threshold value of the cumulative hydrochloric gas supply amount". Note that the recombination lifetime can be found by measuring the time of recombination of the carriers (holes and electrons) in the epitaxial wafer (recombination lifetime) for example by the μ-PCD method.

Now, the technical significance of using the cumulative hydrochloric gas supply amount as an indicator for determining whether or not to replace a component in which a base material including graphite is coated with a silicon carbide film will be described. As illustrated in FIG. 2, when epitaxial growth is performed, regions where the byproduct B is deposited and regions where no byproduct B is deposited are formed on components such as the susceptor 20 or the preheat ring 70. In particular, the regions where no byproduct B is deposited are directly exposed to the hydrochloric gas during cleaning. When the next epitaxial growth is performed with the deposited byproduct being left, LPDs would be formed due to abnormal growth of silicon; accordingly, the supply amount of the hydrochloric gas used in cleaning is set such that over-etching occurs and the byproduct B is completely removed. Accordingly, when the cumulative film thickness of the byproduct B is the same, when a process is performed in which cleaning is performed frequently, the hydrochloric gas supply amount is larger than in the case of performing a process in which cleaning is performed less frequently. As the amount of hydrochloric gas supply increases, etching further proceeds on the regions of the silicon carbide film where no byproduct B is deposited, thus the film thickness of the remaining silicon carbide film is reduced. This increases the amount of graphite in the base material that permeates through the silicon carbide film, and increases the amount of graphite deposited on the surface of the silicon epitaxial layer, thus the quality of epitaxial silicon wafers to be obtained is reduced due to graphite and heavy metal components contained in graphite. Accordingly, when the cumulative film thickness of the byproduct is the same, the film thickness of the remaining silicon carbide film of the regions where no byproduct is deposited varies depending on the frequency of cleaning, which results in a risk of reduction in the quality of epitaxial silicon wafers. By contrast, in this embodiment, the timing for replacing components such as a susceptor is based on the cumulative hydrochloric gas supply amount that has a strong correlation with the film thickness of the remaining silicon carbide film of the regions where no byproduct is deposited, thus the risk of reduction in the quality of epitaxial silicon wafers can be reduced. As a consequence, this disclosure can provide a method of determining the right timing for replacement (whether replacement is needed) that makes it possible to correctly determine the timing for replacing components such as a susceptor (whether replacement is needed).

Referring to FIG. 1, the components to be replaced are preferably one or more components selected from the susceptor 20 and the preheat ring 70. As described above, these components are components in which a base material including graphite is coated with a silicon carbide film. Further, as a component to be replaced, the susceptor 20 is preferably selected. This is because the byproduct is not deposited on most part of the susceptor 20.

[Replacement of Component]

When the process proceeds from step S150 to step S160, in step S160, the heating lamps 60, the dome mounting member 13, the upper dome 11, and the like are demounted, and the component of which silicon carbide film has been worn away is replaced with a new one.

A method of producing an epitaxial silicon wafer has been described using this embodiment as an example; however, this disclosure is not limited to the above embodiment, and modifications may be made as appropriate without departing from the scope defined by the claims.

EXAMPLES

In order to examine the effect of this disclosure, Experiments 1 to 4 were performed in which silicon epitaxial wafers were successively fabricated using the epitaxial growth apparatus illustrated in FIGS. 1 and 2. In each experiment, as a susceptor, one in which graphite was a base material, and the surface of the base material was coated with a silicon carbide film (SiC with a Vickers hardness of 2,346 kgf/mm$^2$) was used.

(Experiment 1)

In Experiment 1, epitaxial silicon wafers were fabricated under the following conditions.

[[Conditions for Epitaxial Growth]]
  Silicon substrate: CZ (Czochralski) substrate
  Source gas: Trichlorosilane ($SiHCl_3$)
  Temperature inside chamber: 1100° C.
  Type of dopant and specific resistance of silicon epitaxial layer: Diborane ($B_2H_6$), 2 Ω·cm
  Film thickness of silicon epitaxial layer: 3 μm

[[Conditions for Cleaning Inside of Chamber]]
  Cleaning frequency: Performed after performing epitaxial growth seven times
  Temperature inside chamber: 1190° C.
  Flow rate of hydrochloric gas: 30 L/min
  Hydrochloric gas supply time: 65 s
  Epitaxial growth was performed 25900 times in total and cleaning was performed 3700 times in total.

Figure 4A:
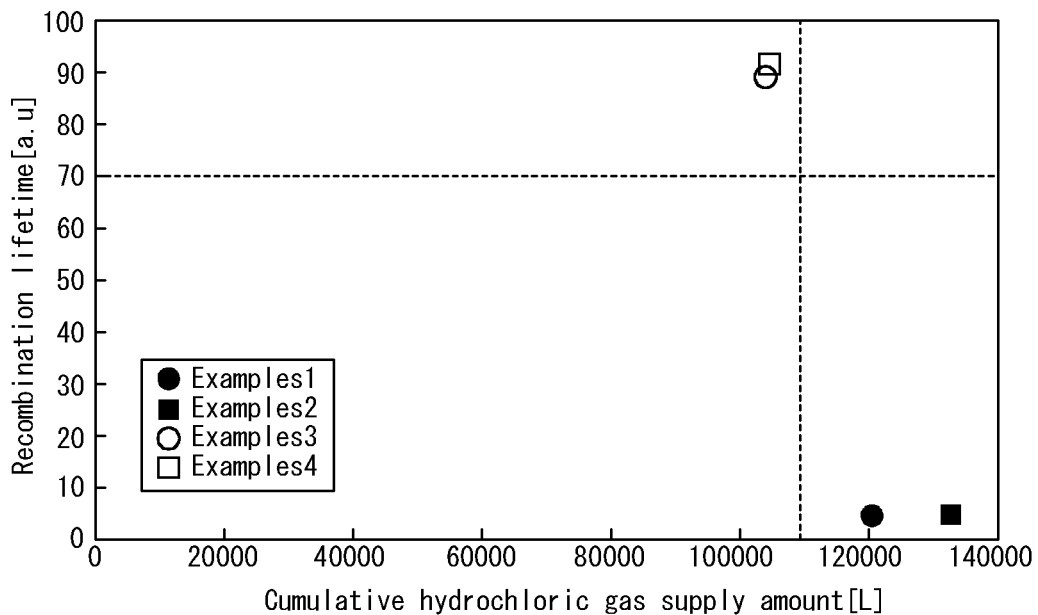
FIG. 4A is a graph of Examples in which the film thickness of a remaining silicon carbide film is plotted against the cumulative hydrochloric gas supply amount.
Figure 4B:
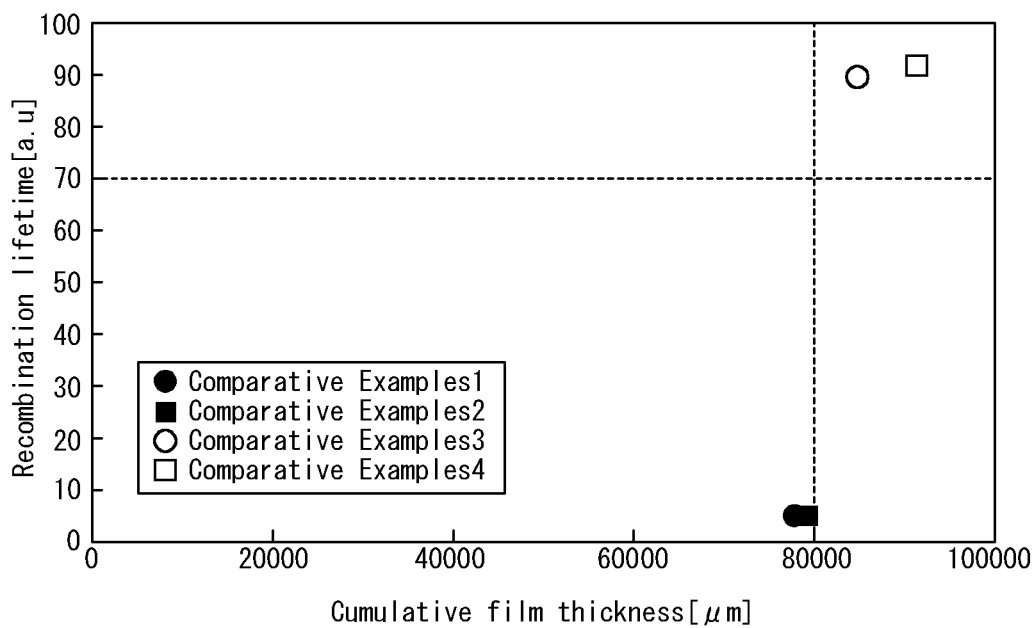
FIG. 4B is a graph of Comparative Examples in which the film thickness of a remaining silicon carbide film is plotted against the cumulative film thickness of silicon epitaxial layers.

After that, a wafer for evaluating the recombination lifetime was subjected to epitaxial growth in the same chamber, and the recombination lifetime was evaluated by the μ-PCD method described above. In FIG. 4A, for Example 1, the recombination lifetime is plotted against the cumulative hydrochloric gas supply amount (120250 L), calculated from the formula (2) and formula (3) above. In FIG. 4B, for Comparative Example 1, the film thickness of the remaining silicon carbide film is plotted against the cumulative film thickness of the silicon epitaxial layers (77700 μm). In Comparative Example 1, since it was difficult to directly measure the cumulative film thickness of the byproduct, the cumulative film thickness of the silicon epitaxial layers that was proportional to the cumulative film thickness of the byproduct was used as an indicator. The above also applies to Experiments 2 to 4 below.

(Experiment 2)

In Experiment 2, epitaxial silicon wafers were fabricated under the following conditions.

[[Conditions for Epitaxial Growth]]
  Silicon substrate: CZ substrate
  Source gas: Trichlorosilane ($SiHCl_3$)
  Temperature inside chamber: 1130° C.
  Type of dopant and specific resistance of silicon epitaxial layer: Diborane ($B_2H_6$), 8 Ω·cm Film thickness of silicon epitaxial layer: 6 μm
[[Conditions for Cleaning Inside of Chamber]]
Cleaning frequency: Performed after performing epitaxial growth five times
Temperature inside chamber: 1190° C.
Flow rate of hydrochloric gas: 30 L/min
Hydrochloric gas supply time: 100 s
Epitaxial growth was performed 13150 times in total and cleaning was performed 2650 times in total.

After that, the recombination lifetime was measured as in Experiment 1. In FIG. 4A, for Example 2, the recombination lifetime is plotted against the cumulative hydrochloric gas supply amount (132500 L), calculated from the formula (2) and formula (3) above. In FIG. 4B, for Comparative Example 2, the film thickness of the remaining silicon carbide film is plotted against the cumulative film thickness of the silicon epitaxial layers (78900 μm).

(Experiment 3)

In Experiment 3, epitaxial silicon wafers were fabricated under the following conditions.
[[Conditions for Epitaxial Growth]]
Silicon substrate: CZ substrate
Source gas: Trichlorosilane ($SiHCl_3$)
Temperature inside chamber: 1120° C.
Type of dopant and specific resistance of silicon epitaxial layer: Diborane ($B_2H_6$), 6 Ω·cm
Film thickness of silicon epitaxial layer: 5 μm
[[Conditions for Cleaning Inside of Chamber]]
Cleaning frequency: Performed after performing epitaxial growth five times
Temperature inside chamber: 1190° C.
Flow rate of hydrochloric gas: 30 L/min
Hydrochloric gas supply time: 61 s
Epitaxial growth was performed 17000 times in total and cleaning was performed 3400 times in total.

After that, the recombination lifetime was measured as in Experiment 1. In FIG. 4A, for Example 3, the recombination lifetime is plotted against the cumulative hydrochloric gas supply amount (103700 L), calculated from the formula (2) and formula (3) above. In FIG. 4B, for Comparative Example 3, the film thickness of the remaining silicon carbide film is plotted against the cumulative film thickness of the silicon epitaxial layers (85000 μm).

(Experiment 4)

In Experiment 4, epitaxial silicon wafers were fabricated under the following conditions.
[[Conditions for Epitaxial Growth]]
Silicon substrate: CZ substrate
Source gas: Trichlorosilane ($SiHCl_3$)
Temperature inside chamber: 1130° C.
Type of dopant and specific resistance of silicon epitaxial layer: Diborane ($B_2H_6$), 10 Ω·cm
Film thickness of silicon epitaxial layer: 12 μm
[[Conditions for Cleaning Inside of Chamber]]
Cleaning frequency: Performed after performing epitaxial growth three times
Temperature inside chamber: 1190° C.
Flow rate of hydrochloric gas: 30 L/min
Hydrochloric gas supply time: 88 s
Epitaxial growth was performed 7650 times in total and cleaning was performed 2550 times in total.

After that, the recombination lifetime was measured as in Experiment 1. In FIG. 4A, for Example 4, the recombination lifetime is plotted against the cumulative hydrochloric gas supply amount (104550 L), calculated from the formula (2) and formula (3) above. In FIG. 4B, for Comparative Example 4, the film thickness of the remaining silicon carbide film is plotted against the cumulative film thickness of the silicon epitaxial layers (91800 μm).

(Description of Evaluation Results)

As illustrated in FIGS. 4A and 4B, the threshold value of the recombination lifetime, which is a measure of the quality of epitaxial silicon wafers, was set to 70 a.u. This means that when the recombination lifetime is significantly below the threshold value, graphite contained in the base material of the susceptor permeates through the silicon carbide film and adversely affects the quality of epitaxial silicon wafers to be obtained. Further, as illustrated in FIG. 4A, the threshold value of the cumulative hydrochloric gas supply amount was set to 110000 L. Further, as illustrated in FIG. 4B, the threshold value of the cumulative film thickness of the silicon epitaxial layers was set to 80000 μm.

As illustrated in FIG. 4B, in Comparative Examples 1 and 2 where the cumulative hydrochloric gas supply amount was large, although the recombination lifetime was below the threshold value, the cumulative film thickness of the silicon epitaxial layers did not reach the threshold value. This means that although the silicon carbide film was etched to an extent that adversely affects the quality of epitaxial silicon wafers, it was wrongly determined that it was not the timing for replacing the susceptor. On the other hand, as illustrated in FIG. 4A, in Examples 1 and 2, the recombination lifetime was below the threshold value, and the cumulative hydrochloric gas supply amount was above the threshold value. This result demonstrates that when the cumulative hydrochloric gas supply amount was used as an indicator, it was correctly determined that it was the right timing for replacing the susceptor. Namely, it was found that when the timing for replacing the susceptor was determined based on the cumulative hydrochloric gas supply amount, the risk of reduction in the quality of epitaxial silicon wafers could be reduced.

As illustrated in FIG. 4B, in Comparative Examples 3 and 4 where the cumulative hydrochloric gas supply amount was small, although the recombination lifetime was not below the threshold value, the cumulative film thickness of the silicon epitaxial layers was above the threshold value. This means that although the silicon carbide film was not etched to an extent that would adversely affect the quality of epitaxial silicon wafers, it was wrongly determined that it was the right timing for replacing the susceptor. This would lead to unnecessary replacement of the susceptor that could be further used, and would increase the production cost. On the other hand, as illustrated in FIG. 4A, in Examples 3 and 4, the recombination lifetime was not below the threshold value, and the cumulative hydrochloric gas supply amount was not above the threshold value. This result demonstrates that when the cumulative hydrochloric gas supply amount was used as an indicator, it was correctly determined it was not the right timing for replacing the susceptor. Namely, it was found that when the timing for replacing the susceptor was determined based on the cumulative hydrochloric gas supply amount, the production cost could also be reduced.

INDUSTRIAL APPLICABILITY

This disclosure reduces the risk of reduction in the quality of epitaxial silicon wafers.

REFERENCE SIGNS LIST

100: Epitaxial growth apparatus
10: Chamber
11: Upper dome

12: Lower dome
13: Dome mounting member
14: Gas supply port
15: Gas discharge port
20: Susceptor
21: Through hole in susceptor
22: Counterbore portion
23: Front surface outermost circumferential portion
24: First vertical wall surface
25: Wafer supporting surface
26: Second vertical wall surface
27: Front surface center portion
30: Susceptor support shaft
31: Main shaft
32: Arm
33: Supporting pin
34: Through hole in arm
40: Lift pin
50: Elevating shaft
51: Main shaft of elevating shaft
52: Supporting shaft
60: Heating lamp
70: Preheat ring
W: Silicon wafer (Epitaxial silicon wafer)
B: Byproduct

The invention claimed is:

1. A method of producing an epitaxial silicon wafer, comprising:
    loading a silicon wafer into a chamber in an epitaxial growth apparatus;
    supplying a source gas into the chamber to grow a silicon epitaxial layer on the silicon wafer, thereby making the silicon wafer form an epitaxial silicon wafer;
    unloading the epitaxial silicon wafer from the chamber; and then
    supplying a hydrochloric gas into the chamber thereby cleaning the inside of the chamber,
    wherein after the cleaning is performed, whether at least one component provided in the chamber is to be replaced or not is determined based on a cumulative amount of the hydrochloric gas supplied,
    the at least one component comprising a base material that includes graphite and is coated with a silicon carbide film.

2. The method of producing an epitaxial silicon wafer, according to claim 1,
    wherein the epitaxial growth apparatus includes a susceptor on which the silicon wafer is placed in the chamber, and a preheat ring provided around the susceptor with a predetermined gap therebetween, and
    the at least one component is one or more components selected from the susceptor and the preheat ring.

3. The method of producing an epitaxial silicon wafer, according claim 1,
    wherein an amount of the hydrochloric gas supplied is measured during the cleaning, and after performing the cleaning before the cumulative amount of the hydrochloric gas supplied exceeds a predetermined threshold value, the at least one component is determined to be replaced.

4. The method of producing an epitaxial silicon wafer, according to claim 2,
    wherein an amount of the hydrochloric gas supplied is measured during the cleaning, and after performing the cleaning before the cumulative amount of the hydrochloric gas supplied exceeds a predetermined threshold value, the at least one component is determined to be replaced.

* * * * *